United States Patent
Yamamuka et al.

[11] Patent Number: 6,110,283
[45] Date of Patent: Aug. 29, 2000

[54] CHEMICAL VAPOR DEPOSITION APPARATUS

[75] Inventors: Mikio Yamamuka; Takaaki Kawahara; Masayoshi Tarutani; Tsuyoshi Horikawa, all of Hyogo, Japan

[73] Assignee: Mitsubishi Denki Kabushiki Kaisha, Tokyo, Japan

[21] Appl. No.: 08/912,938

[22] Filed: Aug. 15, 1997

[30] Foreign Application Priority Data

Mar. 17, 1997 [JP] Japan ................................ 9-063014

[51] Int. Cl.[7] .................................................. C23C 16/00
[52] U.S. Cl. ................... 118/715; 427/126.3; 427/248.1; 427/255.3; 427/255.2; 427/314; 427/419.1; 427/419.2; 427/255.1
[58] Field of Search ............................ 427/255.3, 255.2, 427/126.3, 248.1, 314, 419.1, 419.2; 118/715

[56] References Cited

U.S. PATENT DOCUMENTS

| | | | |
|---|---|---|---|
| 5,204,314 | 4/1993 | Kirlin et al. | 505/1 |
| 5,418,388 | 5/1995 | Okudaira et al. | 257/295 |

FOREIGN PATENT DOCUMENTS

| | | |
|---|---|---|
| 6-158328 | 6/1994 | Japan . |
| 6-310444 | 11/1994 | Japan . |
| 7-94426 | 4/1995 | Japan . |
| 7-268634 | 10/1995 | Japan . |
| 8-176826 | 7/1996 | Japan . |
| 8-186103 | 7/1996 | Japan . |

OTHER PUBLICATIONS

"Surface Morrphologies and Electrical Properties of (BaSr)TiO Films . . . " Kawahara, et al, Jpn. J. Appl. Phys. vol. 34 (1995) pt. 1 No. 9B, Set. 1995 pp. 5077–5082.

"SrTiO Thin Films By MOCVD For 1 Gbit DRAM Application", Lesaicherre et al., Integrated Ferroelectrics, 1995, vol. 8, pp. 201–225.

MOCVD of BASrtiO DOR ULSI DRAMS, Kirlin et al., Integrated Ferroelectrics, 1995, vol. 7, pp. 307–318.

*Primary Examiner*—Leszek Kiliman
*Attorney, Agent, or Firm*—McDermott, Will & Emery

[57] ABSTRACT

A chemical vapor deposition apparatus to reduce generation of contaminants such as residues within the apparatus can be obtained. The chemical vapor deposition apparatus includes a CVD source container, a vaporizer and reaction unit. The vaporizer has a nozzle attached thereto. The nozzle has a tip portion and a thick portion. The reaction unit includes a mixing unit. The mixing unit includes an oxidizer supply pipe as well as a heating portion having a helical side groove and heating means. Reaction unit further includes a reaction chamber surrounded by a wall surface. The inside of the wall surface is covered with an inactive cover layer, and the wall surface is heated to a temperature range of 300–500° C.

18 Claims, 15 Drawing Sheets

CHEMICAL VAPOR DEPOSITION APPARATUS

CROSS-REFERENCE TO RELATED APPLICATION

This application is related to application of Ser. No. of 08/720,751 filed Oct. 1, 1996 now U.S. Pat. No. 5,834,060, commonly assigned to the same applicant.

BACKGROUND OF THE INVENTION

1. Field of the Invention

The present invention relates to chemical vapor deposition apparatuses, and more particularly relates to a chemical vapor deposition apparatus for producing a dielectric thin film such as a semiconductor memory.

2. Description of the Background Art

Higher integration of a semiconductor memory or device is progressing rapidly. The number of bits of the dynamic random access memory (DRAM) exhibits a fourfold increase in three years. This is the result of pursuing a goal of higher integration, lower power consumption, and lower cost of the device. Even if the degree of integration is improved, a capacitor as one component of the DRAM should have a certain capacitance. Although the film thickness of the material for the capacitor insulating film should be decreased, the $SiO_2$ which is heretofor used has limitations in decreasing its film thickness.

If the dielectric constant of the capacitor insulating film can be increased by utilizing another material, both of a thinner thickness of the film and enough capacitance can be attained. Accordingly, respective companies are carrying out an investigation on the use of a thin film formed of high dielectric material for the capacitor insulating film of the memory device.

The most important performances required of such a capacitor insulating film are that it is a thin film of a high dielectric constant and that the leakage current is small. In other words, as long as the high dielectric constant material is utilized, it should be as thin as possible and the leakage current should be as small as possible. As goals in the development, a film thickness of at most 0.5 nm as converted to $SiO_2$ equivalent, and leakage current density of at most $2 \times 10^{-7} A/cm^2$ when a voltage of 1V is applied are generally desirable.

In order to form a thin film over an electrode for the capacitor of the DRAM having steps, the chemical vapor deposition (CVD) is advantageous since the coverage of a surface having a complex shape is excellent. According to the CVD, a liquid source obtained by dissolving an organometallic complex containing a specific metal in an organic solvent is used as the material for a thin film having a high dielectric constant. By vaporizing the liquid source and dispersing the obtained gas over a substrate or the like, a thin film of a high dielectric constant is formed.

A serious problem in this case is that there is no liquid source having a stable and excellent vaporization property. The reason is that a compound of dipivaloylmethane (DPM) of β-diketone system with metal which is mainly employed as the organometallic complex does not exhibit a good vaporization property when heated.

The inventors of this application suggested to use a CVD material which is a liquid source obtained by dissolving the organometallic complex in an organic solvent of tetrahydrofuran (THF), and thus acquired a significantly improved vaporization property in Japanese Patent Laying-Open No. 6-158328. However, even if the liquid source above is applied to a conventional CVD apparatus used for the liquid source to produce a dielectric film, desirable results are not necessarily produced.

The inventors accordingly suggested a CVD apparatus for the liquid source in which the liquid source is vaporized enough to be stably supplied to a reaction chamber (Japanese Patent Laying-Open Nos. 6-310444 and 7-094426).

Generally, TTIP[$Ti(O-i-Pr)_4$] is utilized as the organometallic complex containing titanium as the metal. According to Japanese Patent Laying-open No. 7-268634, $TiO (DPM)_2$ of DPM system is used so that a highly improved coverage of a thin film can be obtained. Further, a process of forming a film consisting of two steps of crystallizing an initial film by annealing, and thereafter depositing a film of the second layer is effective in order to obtain surface morphology and an electrical property superior to a single layer film.

A CVD apparatus for the liquid source is further proposed which is provided with the FTIR or the like for optically monitoring the process of forming a film in-situ. A lower electrode structure is further proposed which is suitable for the BST [$(Ba, Sr) TiO_3$] film produced by a CVD process in which the liquid source is vaporized (Japanese Patent Laying-Open Nos. 8-176826 and 8-186103).

However, the apparatus for liquid source CVD does not provide formation of a film having a good property (including an electrical property) when it is used as an apparatus for producing a dielectric film.

A conventional apparatus for liquid source CVD is hereinafter described. Referring to FIG. 15, the apparatus for liquid source CVD includes a CVD source container 103, a vaporizer 105, and a reaction chamber 111. CVD source container 103 stores a liquid CVD source obtained by dissolving an organometallic complex containing a prescribed metal in an organic solvent. Vaporizer 105 is used for vaporizing the liquid CVD source delivered from a source supply unit 115. The vaporized CVD source is mixed with oxygen as an oxidizer in a mixer portion 107. The oxygen is transported through an oxidizer supply pipe 121. The CVD source produced by the vaporization and mixing with oxygen is dispersed over a substrate 111c fron a gas nozzle 111d. Substrate 111c is mounted on a stage 111b in a reaction chamber 111e.

A process of forming a film utilizing the above apparatus for liquid source CVD is described below. A pressure gas such as nitrogen is introduced from a pressure pipe 113 into CVD source container 103. The pressure in CVD source container 103 accordingly increases and the liquid CVD source is delivered to vaporizer 105. At this time, the flow rate of the CVD source is controlled by source supply unit 115. Further, nitrogen is introduced from a carrier gas introduction pipe 104. The liquid CVD source is sprayed into a vaporize chamber within the vaporizer and vaporized to become a CVD source gas.

The CVD source gas passes through a source gas transport pipe 117 and arrives at mixer portion 107. A transport pipe heater 141 provided around source gas transport pipe 117 prevents the CVD source gas from liquefying. A vent line 152 is connected to source gas transport pipe 117. In mixer portion 107, the CVD source gas is mixed with oxygen. The CVD source gas mixed with oxygen is spouted from gas nozzle 111d. A thin film is thus formed on the substrate heated by a substrate heater.

Organometallic complexes respectively containing Ba, Sr, and Ti are dissolved in the organic solvent and used as the liquid source. Although only one line of CVD source container 103 is shown in FIG. 15, actually three lines of CVD source containers 103 are provided. The liquid CVD source is supplied from respective CVD source containers to one vaporizer 105.

Reaction chamber 111 has an oxygen ambience and a pressure of 1–10 Torr. The temperature of the substrate heater is set at 400–600° C. since an excellent coverage can be obtained when the temperature at formation of a film is relatively low. The flow rate of the liquid source and the time for the formation of a film are controlled such that the rate of the film formation is 30 Å/min and the film thickness is 300 Å. A film formed on the substrate is the BST film [(Ba, Sr) TiO$_3$]. The film is produced such that the ratio of composition of the BST film, (Ba+Sr)/Ti, is 1.0.

A sample is prepared by forming the BST film on a lower electrode such as Pt or Ru, and forming an upper electrode such as Pt or Ru on the BST film. Utilizing the sample, an electrical property of the BST film such as the leakage current or the film thickness as converted to an oxide film equivalent is measured.

In order to produce the BST film by the apparatus for liquid source CVD described above, a liquid source obtained by dissolving an organometallic compound of DPM system in an organic solvent is used as a CVD material. A gas-liquid mixture of the liquid source and the carrier gas is sprayed from a Teflon nozzle having an outer diameter of 1/16 inches to a vaporization system having a temperature of 250° C. At this time, condensation of the liquid source causes clogging of the tip portion of the nozzle. Repetition of the film formation generates some residues on an inner side face of the vaporize chamber. As a result, BST films having the same composition and film thickness cannot be produced stably.

The residue may stick to an inner wall of a pipe connecting a vaporizer and a reaction chamber. If the residue enters the reaction chamber and is taken into a film during the film formation process, the film quality deteriorates.

A source gas is mixed with oxygen as an oxidizer in the mixer portion. If the temperature of the oxygen does not increase enough, the source gas is cooled down to be condensed in the mixer portion. As a result, clogging of the mixer portion could occur.

Each time a film is formed, the residue is generated inside the mixer portion. The oxygen having a relatively lower temperature diffuses back into a source gas transport pipe so that the source gas is cooled to be condensed during formation of a film. As a result, stable formation of films having the same composition and thickness cannot be provided.

When the source gas is introduced into a reaction chamber through a gas nozzle, the temperature of the gas nozzle should be kept at a temperature which is at least the sublimation temperature or the boiling point of the CVD source. Especially a CVD source of the organometallic compound of DPM system such as Ba(DPM)$_2$ is suffered from pylolysis if its temperature rises to a point approximately 10–20° C. higher than the sublimation temperature or the boiling point. Therefore, the temperature of the gas introduction system should be controlled precisely.

However, especially the temperature of the edge portion of the gas nozzle of a gas head often rises above a prescribed temperature due to the heat radiated from a substrate heated to approximately 400–600° C. On the other hand, the temperature of the edge portion of the gas nozzle sometimes falls below a prescribed temperature due to the radiation or conduction of the heat from the gas nozzle to a chamber having a relatively low temperature. As a result, the vaporized CVD source is decomposited or solidified. Further, holes of the gas nozzle could be clogged.

During formation of the film, if a reaction product sticking to an inner wall of the reaction chamber is peeled off onto the substrate, the film quality would deteriorate.

In the conventional apparatus for liquid source CVD, contaminants such as residues of the CVD source stick to the vaporize chamber, the nozzle, the source transport pipe or the like. Contaminants such as the reaction product or the like stick to the inner wall of the reaction chamber. Consequently, a CVD source gas having a prescribed flow rate or component often fails to be dispersed over the substrate. Further, some contaminants drop onto the substrate. As a result, stable formation of a desired thin film on a substrate becomes impossible.

SUMMARY OF THE INVENTION

The present invention is made to solve the problems described above. One object of the present invention is to provide a chemical vapor deposition apparatus in which generation of contaminants such as residues of a CVD material, reaction products or the like is reduced.

A chemical vapor deposition apparatus according to one aspect of the invention includes a source container for storing a CVD source obtained by dissolving a metallic compound in a solvent, a vaporizer connected to the source container for vaporizing the CVD source supplied from the source container, and a reaction unit connected to the vaporizer for dispersing the vaporized CVD source delivered from the vaporizer over a substrate to form a thin film. The vaporizer includes a vaporization chamber and a nozzle for vaporizing the CVD source supplied from the source container. The nozzle is formed of a metal and includes a nozzle tip portion and a nozzle thick portion having a thick portion connected to the nozzle tip portion for introducing the CVD source into the vaporization chamber.

According to this structure, the temperature of the nozzle tip portion and its vicinity is prevented from rising since the heat of the nozzle tip portion is conducted to the nozzle thick portion. Further, deformation of the nozzle is prevented. The amount of contaminants generated by decomposition of the CVD source at the nozzle tip portion is thus reduced, and clogging of the nozzle is also prevented. A prescribed amount of CVD source is accordingly vaporized to be supplied to the reaction unit. As a result, the quality of a thin film formed on the substrate is stabilized.

A chemical vapor deposition apparatus according to another aspect of the invention includes a source container for storing a CVD source obtained by dissolving a metallic compound in a solvent, a vaporizer connected to the source container for vaporizing the CVD source supplied from the source container, and a reaction unit connected to the vaporizer for dispersing the vaporized CVD source delivered from the vaporizer over a substrate to form a thin film. The reaction unit includes a mixing unit for mixing the vaporized CVD source delivered from the vaporizer with an oxidizer. The mixing unit includes an oxidizer supply pipe for supplying the vaporize CVD source with the oxidizer, and a heating portion. The heating portion includes a helical side groove provided to the oxidizer supply pipe in the direction of the flow of the oxidizer, and a heating unit.

According to this structure, especially the oxidizer mixed with the vaporized CVD source is efficiently heated in a short period. The vaporized CVD source mixed with the oxidizer is never cooled to generate some contaminants such as residues. A prescribed amount of the vaporized CVD source is transported to the reaction unit. As a result, the quality of a thin film formed over a substrate is stabilized.

A chemical vapor deposition apparatus according to still another aspect of the invention includes a source container for storing a CVD source obtained by dissolving a metal compound in a solvent, a vaporizer connected to the source container for vaporizing the CVD source supplied from the source container, and a reaction unit connected to the vaporizer for dispersing the vaporized CVD source delivered from the vaporizer over a substrate to form a thin film. The reaction unit is provided with a reaction chamber surrounded by a wall surface. An inner wall surface of the reaction chamber is covered with an inactive cover layer and heated to a temperature range of 300 to 500° C.

According to this structure, almost no reaction product sticks to the inner wall of the reaction chamber heated to 300–500° C. As a result, dropping of any reaction product onto a substrate is prevented and the quality of a thin film formed over the substrate is stabilized. Further, cleaning of the inner wall of the reaction chamber becomes easier and an availability factor of the chemical vapor deposition apparatus is improved.

Preferably, the vaporizer in each of the chemical vapor deposition apparatuses described above is provided with a vaporization chamber containing a space of a substantially cylindrical shape. The CVD source supplied from the source container is introduced from a cylindrical side surface surrounding the cylindrical space into the vaporization chamber. The vaporized CVD source is delivered from the cylindrical side surface to the reaction unit.

In this case, the CVD source introduced into the vaporization chamber flows along the cylindrical side surface. Most of the CVD source smoothly circulates within the vaporization chamber. Accordingly, the CVD source stays in the vaporization chamber for a longer time so that vaporization is fully carried out. The amount of residues of the CVD source which have not vaporized and remain within the vaporization chamber is reduced. The fully vaporized CVD source is discharged from the cylindrical side surface without disturbing the flow of the CVD source circulating within the vaporization chamber. Accordingly, a prescribed amount of the vaporized CVD source is delivered to the reaction unit. As a result, a thin film having a stable film quality formed over a substrate can be obtained.

Preferably, the chemical vapor deposition apparatus includes a source transport pipe, a cleaning fluid supply unit, and a cleaning fluid discharge unit. The source transport pipe delivers the vaporized CVD source from the vaporization chamber to the reaction chamber. The cleaning fluid supply unit introduces a cleaning fluid into the source transport pipe. The cleaning fluid discharge unit discharges the cleaning fluid introduced into the source transport pipe.

In this case, the cleaning fluid is introduced into the source transport pipe by the cleaning fluid supply unit. The cleaning fluid introduced into the source transport pipe is discharged by the cleaning fluid discharge unit. Some contaminants sticking to the inside of the source transport pipe are removed so that a prescribed amount of the vaporized CVD source can be supplied from the vaporizer to the reaction unit stably. As a result, the quality of the thin film formed over a substrate is stabilized.

Preferably, the reaction unit includes a heating unit for heating a substrate, and a gas nozzle for dispersing the vaporized CVD source over the substrate. A surface of the gas nozzle is processed to have a reflectance for the heat ray exceeding a prescribed reflectance, or to have thermal absorbency for the heat ray exceeding prescribed thermal absorbency.

In this case, when the surface of the gas nozzle is processed to have a reflectance for the heat ray exceeding a prescribed one, the surface of the gas nozzle reflects most of the heat ray (infrared ray) radiated from the heating unit, thereby preventing the temperature of the gas nozzle from excessively rising. On the other hand, when the surface of the gas nozzle is processed to have the thermal absorbency for the heat ray exceeding prescribed one, absorption of the heat ray by the gas nozzle radiated from the heat unit is promoted thereby making up the loss of the heat due to the radiation from the gas nozzle or the conduction to the reaction unit, and compensating for the fall of the temperature of the gas nozzle.

Preferably, the vaporizer includes a nozzle for introducing the CVD source into the vaporizer and a nozzle-insert-pipe having the nozzle inserted. An inert gas is introduced into the nozzle-insert-pipe, and the inert gas introduced into the nozzle-insert-pipe is then spouted from the nozzle.

Particularly when the liquid CVD source is sprayed from the nozzle, an inert gas is spouted from the nozzle-insert-pipe to surround the sprayed CVD source. Accordingly, the CVD source is smoothly sprayed without being stopped, and clogging of the nozzle is prevented. The liquid CVD source is thus vaporized and a prescribed amount of the vaporized CVD source is supplied to the reaction unit. As a result, the quality of a thin film formed over a substrate is stabilized.

Preferably, organometallic complexes respectively containing Ba, Sr, and Ti are used as metal compounds, and an organic solvent is used as a solvent.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
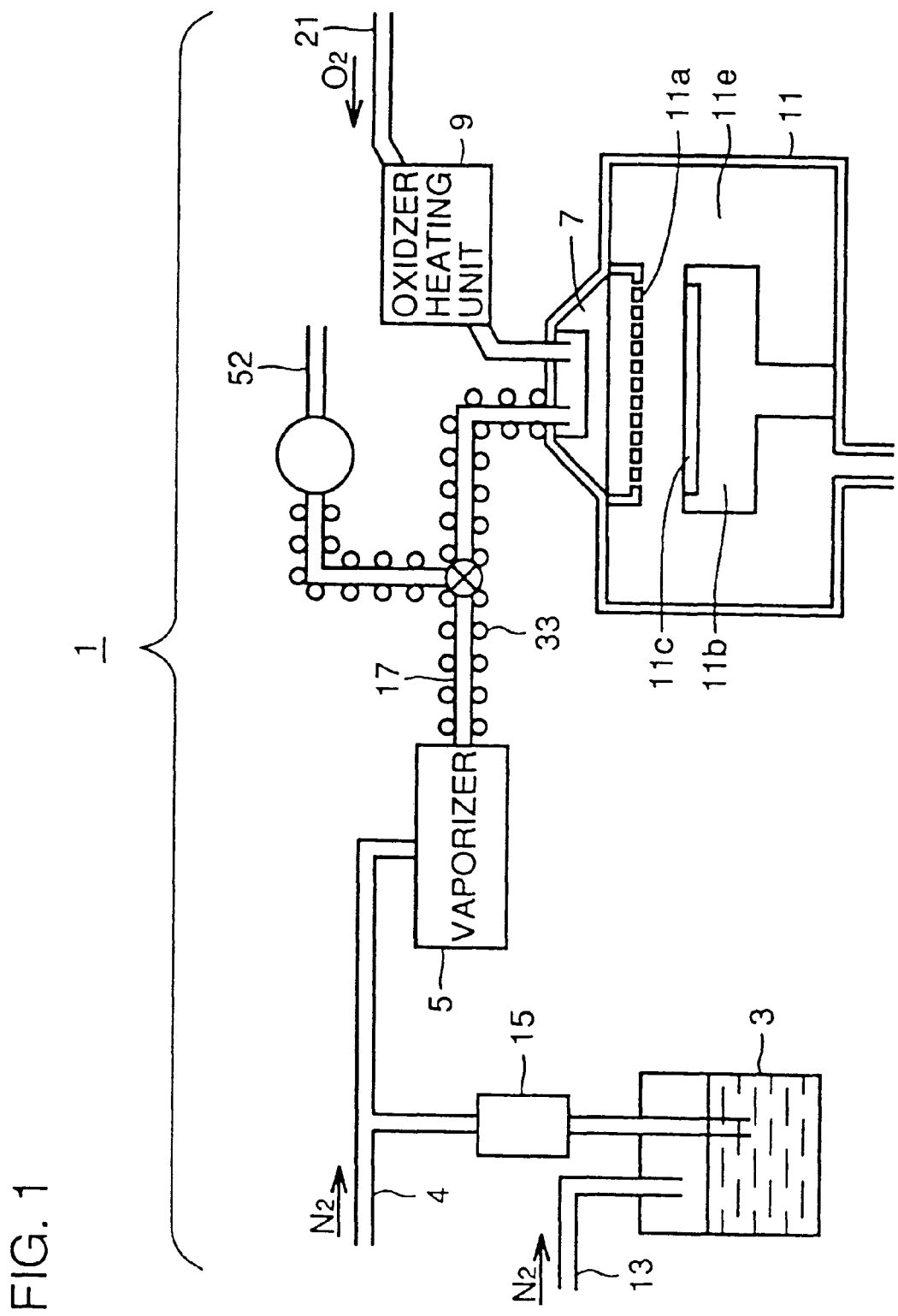
FIG. 1 shows a structure of a chemical vapor deposition apparatus according to the first embodiment of the present invention.

A chemical vapor deposition apparatus according to the first embodiment will be described referring to the figure. With reference to FIG. 1, a chemical vapor deposition apparatus 1 includes a CVD source container 3, a vaporizer 5 and a reaction unit 11. CVD source container 3 is provided with a pressure pipe 13 for pushing out and delivering a CVD source by pressure. Between CVD source container 3 and vaporizer 5, a source supply unit 15 is provided for supplying a prescribed amount of the CVD source.

The CVD source passing through source supply unit 15 is mixed with nitrogen introduced from a carrier gas introduction pipe 4 to become a gas-liquid mixture. A pipe heater 33 is provided to a source transport pipe 17 connecting vaporizer 5 with a mixer portion 7. A vent line 52 is further provided to source transport pipe 17 for discharging any unnecessary CVD source at the purging or the like.

Reaction unit 11 has mixer portion 7. An oxidizer supply pipe 21 is connected to mixer portion 7 for supplying oxygen thereto as an oxidizer. Oxidizer supply pipe 21 is provided with an oxidizer heating unit 9. Reaction unit 11 includes a reaction chamber 11e. Within reaction chamber 11e, a gas head 11a for spouting out the vaporized CVD source as well as a stage 11b on which a substrate 11c is mounted are provided.

A liquid source obtained by dissolving organometallic complexes respectively containing Ba, Sr and Ti in an organic solvent is used. Specifically, for the organometallic complexes, barium dipivaloylmethanato [Ba(DPM)$_2$], strontium dipivaloylmethanato [Sr(DPM)$_2$], and titanyl dipivaloylmethanato [TiO(DPM)$_2$] are utilized. For the solvent, tetrahydrofuran (THF) is used. In this case, a BST film [(Ba,Sr)TiO$_3$] is formed over a substrate.

Although only one line of CVD source container 3 is shown in FIG. 1, actually three lines of CVD source containers 3 are provided. The liquid source is supplied from respective CVD source containers to one vaporizer 5.

Figure 2C:
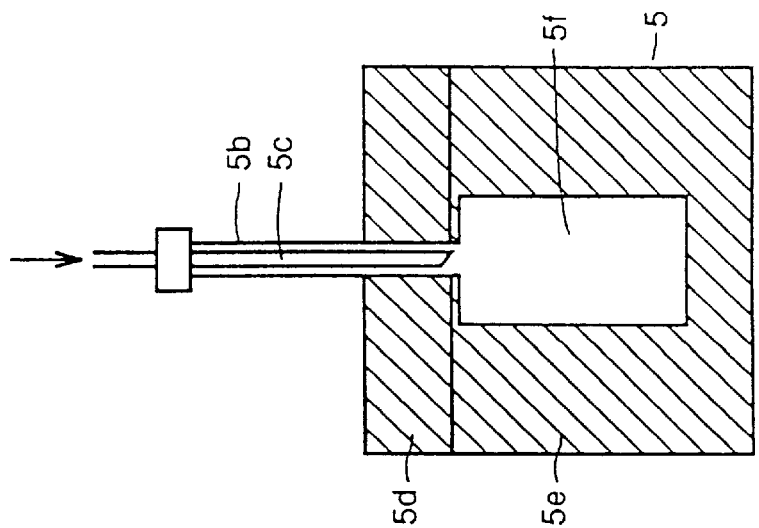
FIGS. 2A, 2B, and 2C respectively show a top view, a cross sectional view taken along the line 2B—2B in FIG. 2A, and a cross sectional view taken along the line 2C—2C in FIG. 2A of a vaporizer of the chemical vapor deposition apparatus according to the first embodiment.
Figure 2B:
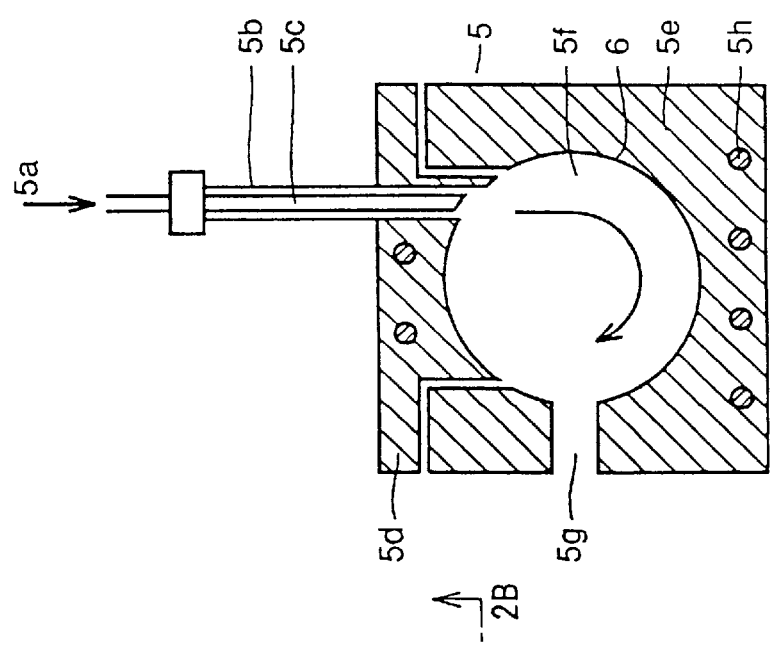
Figure 2A:
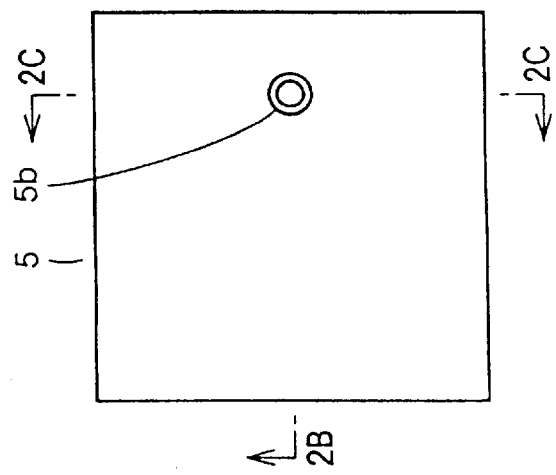

Vaporizer 5 of the chemical vapor deposition apparatus according to the first embodiment has a structure shown in FIGS. 2A–2C. Referring to FIG. 2B, in vaporizer 5, a vaporization chamber 5f is formed by an upper portion 5d and a lower portion 5e of the vaporizer. Vaporization chamber 5f has a substantially cylindrical shape. A pipe for nozzle insertion 5b having a nozzle 5c attached thereto is provided to vaporizer upper portion 5d. Specifically, nozzle 5c is attached to a circumferential surface 6 corresponding to the cylindrical side surface of cylindrical vaporization chamber 5f. It is noted that the nozzle is formed of Teflon and has an outer diameter of 1/16 inches. The outer diameter of pipe for nozzle insertion 5b is 1/8 inches.

A hole 5g for connection of source transport pipe is provided to vaporizer lower portion 5e for supplying the source gas to the reaction chamber. A source transport pipe is thus connected to circumferential surface 6. A rod heater 5h is provided to upper portion 5d and lower portion 5e of the vaporizer. Rod heater 5h maintains the temperature within vaporization chamber 5f at approximately 250° C.

A method of forming a thin film using the chemical vapor deposition apparatus is described below. Referring to FIG. 1 and FIG. 2B, the liquid CVD source in the CVD source container is pushed out and delivered to vaporizer 5 by a pressure gas such as nitrogen which is introduced into pressure pipe 13. At this time, the flow rate of the liquid CVD source is controlled by source supply unit 15. After passing through source supply unit 15, the liquid CVD source is mixed with nitrogen as a carrier gas to become a gas-liquid mixture. The gas-liquid mixture is sprayed from nozzle 5c and circulates along circumferential surface 6 within vaporization chamber 5f.

The circulating flow causes the gas-liquid mixture to stay within vaporization chamber 5f for a longer time. Accordingly, the liquid CVD source is vaporized enough to reduce any residue within vaporization chamber 5f. The vaporized CVD source is used as a CVD source gas. The CVD source gas arrives at mixer portion 7 through source transport pipe 17. The CVD source gas is mixed with oxygen as an oxidizer at mixer portion 7. The CVD source gas mixed with oxygen is dispersed over substrate 11c via a plurality of gas nozzles 11d provided to gas head 11a.

According to this structure, the gas-liquid mixture stays in vaporization chamber 5f for a longer time period. The liquid CVD source is thus sufficiently vaporized, and an amount of residues within vaporization chamber 5f is decreased. The vaporized CVD source is discharged from hole 5g for connection of supply transport pipe provided to circumferential surface 6. A prescribed amount of the CVD source gas is supplied to reaction unit 11. As a result, BST films having the same film quality can be produced stably through a long time. Specifically, the frequency of the cleaning within vaporization unit 5 is decreased from once per formation of one hundred BST films to once per formation of three hundreds BST films.

Second Embodiment

Figure 3:
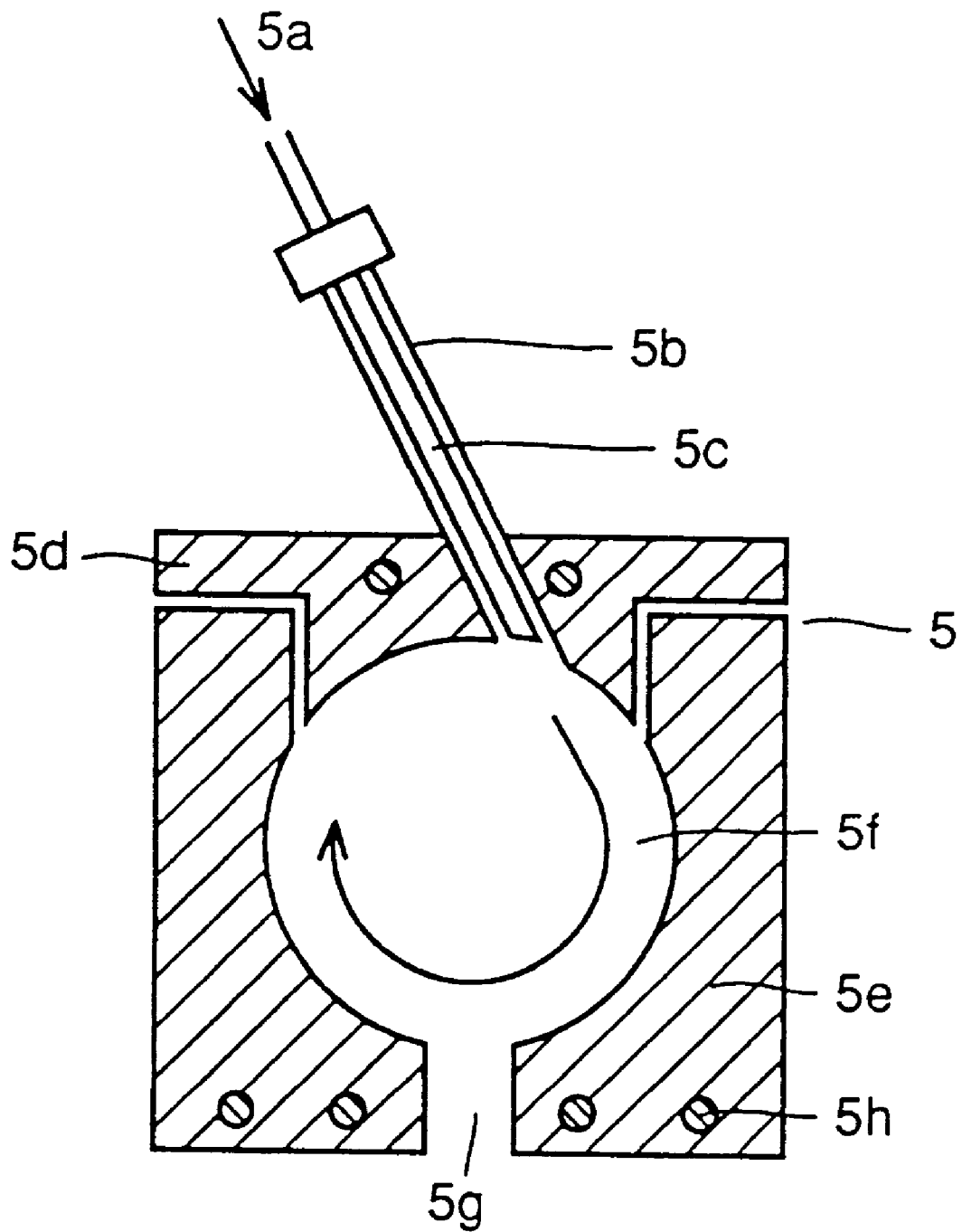
FIG. 3 is a cross section of a structure of a vaporizer of a chemical vapor deposition apparatus according to the second embodiment.

A chemical vapor deposition apparatus according to the second embodiment is described referring to the figure. A vaporizer of the chemical vapor deposition apparatus has a structure illustrated in FIG. 3. With reference to FIG. 3, a pipe for insertion of nozzle 5b having a nozzle 5c inserted thereto is provided such that the gas-liquid mixture is spouted from nozzle 5c in the direction of the tangent of circumferential surface 6 of vaporization chamber 5f. Detailed description of those structure equivalent to those of the chemical vapor deposition apparatus described in the first embodiment will be omitted.

In the chemical vapor deposition apparatus according to the second embodiment, the gas-liquid mixture introduced into the vaporization chamber most smoothly circulates within vaporization chamber 5f along circumferential surface 6 of vaporization chamber 5f without turbulence. As a result, the gas-liquid mixture stays in vaporization chamber 5f for a further long time. Therefore, the liquid CVD source is further sufficiently vaporized so that the amount of residues within vaporization chamber 5f is reduced. As a result, stable formation of a film over a long period can be realized. Specifically, the frequency of the cleaning within the vaporizer is decreased from once per formation of one hundred BST films to once per formation of four hundreds films.

As shown in FIG. 3, a connecting portion of source transport pipe 5g for directing the vaporized CVD source gas to the reaction unit may be provided to a lower portion of circumferential surface 6 of vaporization chamber 5f. In this case, the reaction unit is placed adjacent to a portion directly under vaporization unit 5, and the vaporizer and the reaction unit are connected by an approximately linear source transport pipe. Accordingly, a chemical vapor deposition apparatus having simpler structure can be obtained.

Third Embodiment

Figure 4:
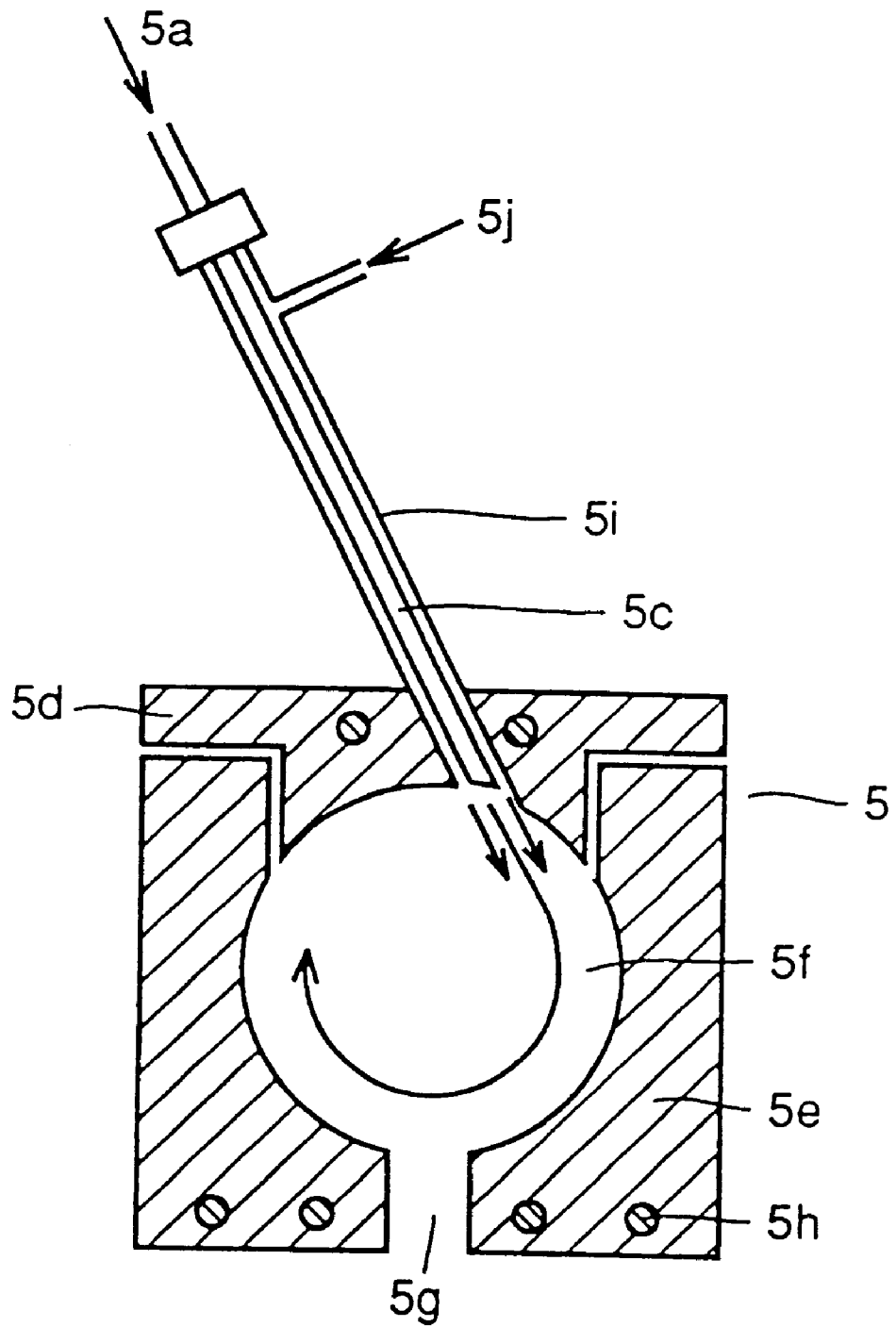
FIG. 4 is a cross sectional view illustrating a structure of a vaporizer of a chemical vapor deposition apparatus according to the third embodiment.

A chemical vapor deposition apparatus according to the third embodiment is described referring to the figure. A vaporizer of the chemical vapor deposition apparatus has a structure shown in FIG. 4. With reference to FIG. 4, vaporizer 5 is provided with a pipe for insertion of nozzle with assist gas inlet 5i having an introduction inlet for introducing an assist gas 5j into a pipe into which nozzle 5c is inserted. The outer diameter of pipe for insertion of nozzle with assist gas inlet 5i is 1/8 inches. The outer diameter of nozzle 5c is 1/16 inches. Detailed description of the structures equivalent to those of the chemical vapor deposition apparatus according to the second embodiment will be omitted.

In the chemical vapor deposition apparatus according to the third embodiment, when the gas-liquid mixture is sprayed from the nozzle, the assist gas is simultaneously sprayed such that it surrounds the gas-liquid mixture. Therefore, the gas-liquid mixture is smoothly sprayed from the nozzle without remaining in the nozzle. Clogging of the tip portion of the nozzle with the CVD source is thus prevented. The assist gas is also effective in preventing the nozzle and the gas-liquid mixture from rising above a prescribed temperature.

Preferably, the assist gas is an inert gas such as nitrogen. Stainless may be used as the material for the nozzle. Further, vaporization chamber 5f may have a prism shape, for example, other than the cylindrical one.

Fourth Embodiment

Figure 5:
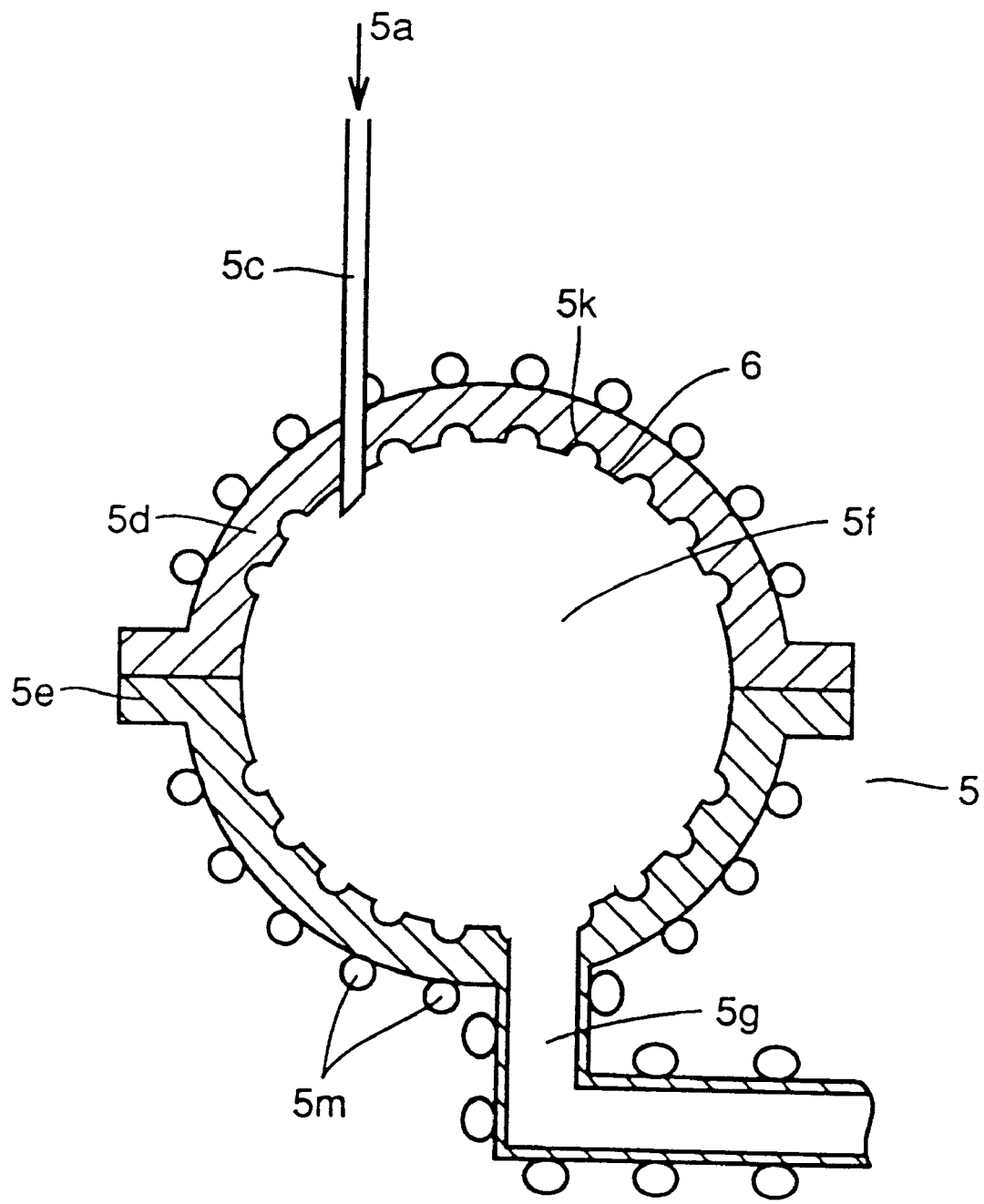
FIG. 5 is a cross section of a structure of a vaporizer of a chemical vapor deposition apparatus according to the fourth embodiment.

A chemical vapor deposition apparatus according to the fourth embodiment is described referring to the figure. A vaporizer of the chemical vapor deposition apparatus has a structure shown in FIG. 5. Specifically, with reference to FIG. 5, a concave portion 5k is provided to circumferential surface 6 of vaporization chamber 5f. A tape heater 5m is provided to upper and lower portions of the vaporizer 5d and 5e. Those structures similar to those of the chemical vapor deposition apparatus according to the first embodiment are not described.

In the chemical vapor deposition apparatus according to the fourth embodiment, a surface area of circumferential surface 6 is increased by providing concave portion 5k. The gas-liquid mixture introduced into vaporization chamber 5f circulates within vaporization chamber 5f along circumferential surface 6. At this time, the liquid CVD source sticking to circumferential surface 6 vaporizes earlier compared with the source in the conventional vaporizer. The liquid CVD source is further sufficiently vaporized accordingly. In the conventional vaporizer, the liquid source which has not been vaporized remains within the vaporization chamber as a residue. On the other hand, the vaporizer according to the fourth embodiment has almost no residue generated. The uniformity of the quality of the film such as the ratio of the composition of the BST film is improved by fully vaporizing the liquid CVD source.

Although concave portion 5k is formed at circumferential surface 6 of vaporization chamber 5f, a convex portion may be formed to obtain a similar effect.

Fifth Embodiment

Figure 6:
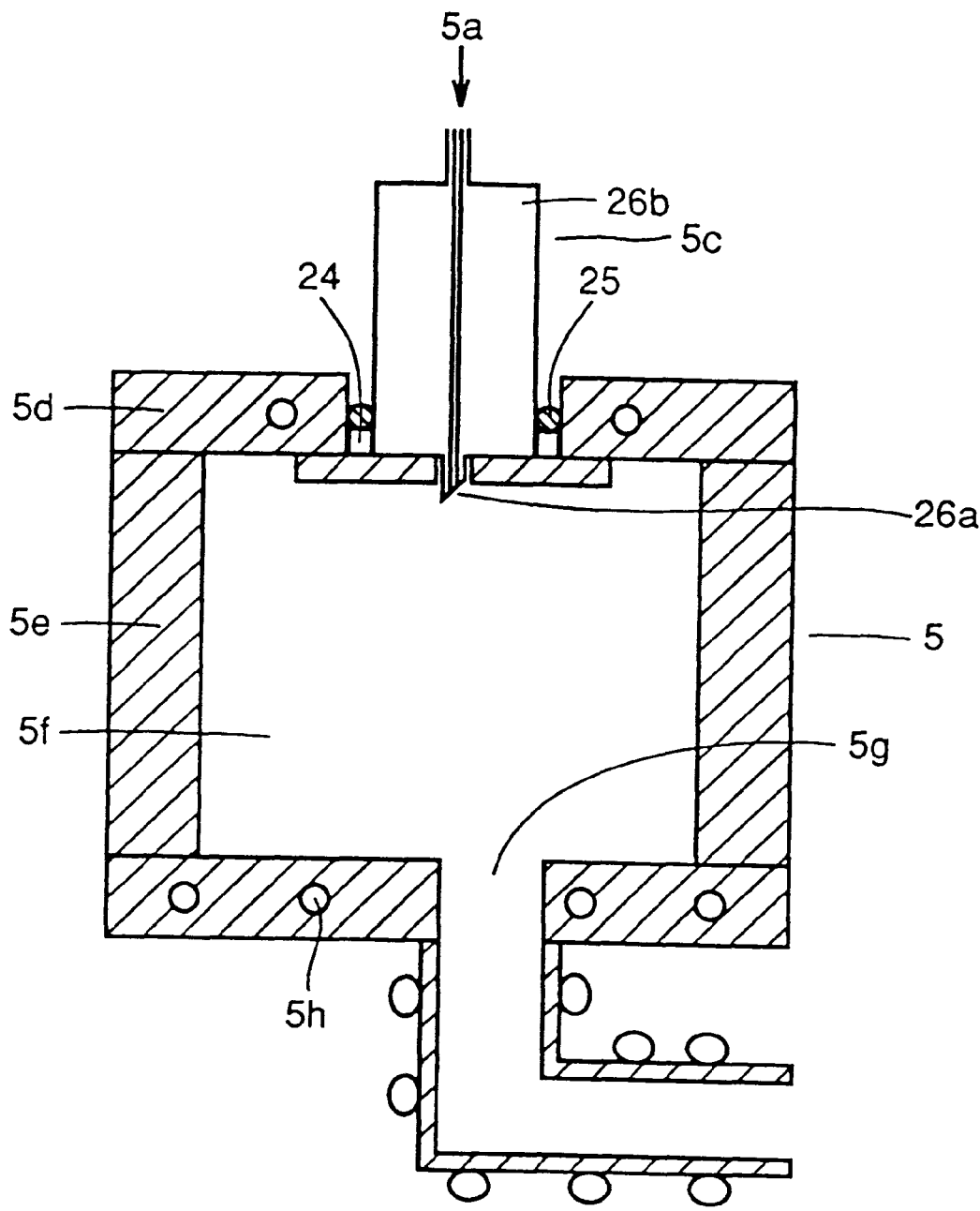
FIG. 6 illustrates a cross section of a structure of a vaporizer of a chemical vapor deposition apparatus according to the fifth embodiment.

A chemical vapor deposition apparatus according to the fifth embodiment is now described referring to the figure. The apparatus has a vaporizer having a structure shown in FIG. 6. With reference to FIG. 6, vaporizer 5 has vaporization chamber 5f formed by upper and lower portions of the vaporizer 5d and 5e. Nozzle 5c is attached to upper portion of vaporizer 5d. Nozzle 5c is formed of stainless and has a nozzle tip portion 26a and a nozzle thick portion 26b. The outer diameter of nozzle tip portion 26a is 1/16 inches. Nozzle thick portion 26b has an outer diameter of 30 mm. Between upper portion of vaporizer 5d and nozzle thick portion 26b, an aluminum plate 24 and a heat-resistant O-ring 25 are provided. Those structures equivalent to those according to the first embodiment will not be described in detail.

The temperature in vaporization chamber 5f is maintained at approximately 250° C. by rod heater 5h. In the apparatus according to the fifth embodiment, nozzle 5c is formed of stainless so that deformation due to the heat is not found different from the nozzle formed of Teflon. Further, nozzle 5c is provided with tip portion 26a and thick portion 26b. Therefore, the heat of the tip portion 26a is readily conducted to nozzle thick portion 26b. Accordingly, only the temperature of the nozzle tip portion and its vicinity rises by a suitable degree without excessively increasing, so that clogging of the nozzle with the CVD source is prevented. A prescribed amount of the CVD source is sprayed from the nozzle. As a result, the BST film can be formed stably over a long period. Specifically, the frequency of the cleaning within the vaporizer can be reduced from once per formation of one hundred BST films to once per formation of three hundred films.

Although the cross section of vaporization chamber 5f shown in FIG. 6 has a substantially rectangular shape, a similar effect can be obtained even if the cross section has those structures according to the first to the fourth embodiments.

Sixth Embodiment

Figure 7A:
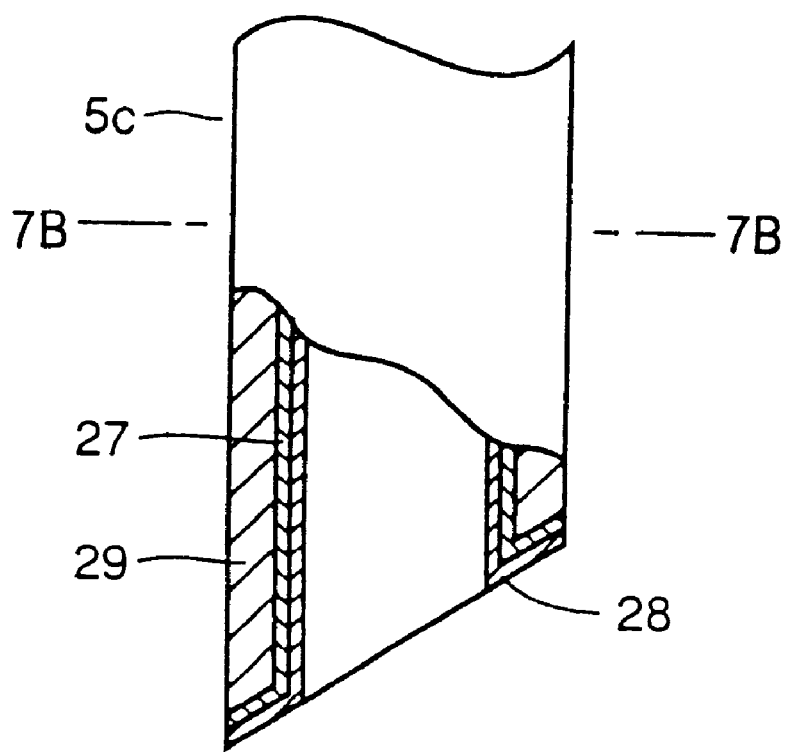
FIGS. 7A and 7B respectively show a vertical cross sectional structure and a transverse cross section along the line 7B—7B in FIG. 7A of a nozzle of a vaporizer of a chemical vapor deposition apparatus according to the sixth embodiment.
Figure 7B:
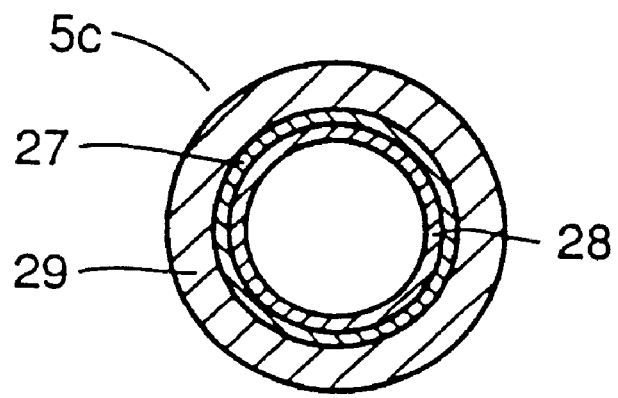

A chemical vapor deposition apparatus according to the sixth embodiment will be described referring to the figure. A nozzle of the apparatus for introducing the CVD source into the vaporization chamber has a structure shown in FIGS. 7A and 7B. Referring to FIGS. 7A and 7B, a nozzle 5c has a Teflon impregnation layer 28 formed on a nozzle stainless portion 29 with intervening porous ceramics 27. FIG. 7B illustrates a cross section taken along the line 7B—7B in FIG. 7A. The structures except for those described above are similar to those according to the first to the fifth embodiments or the combination thereof, and detailed descriptions thereof are omitted.

The chemical vapor deposition apparatus of the sixth embodiment has Teflon impregnation layer 28 formed inside the nozzle. Since the Teflon has an extremely small wettability, the gas-liquid mixture is smoothly supplied to the vaporization chamber without staying in the nozzle. Specifically, the frequency of the cleaning within the vaporizer is decreased from once per formation of one hundred BST films to once per formation of four hundreds films. Further, the quality of the film such as the ratio of the composition of the BST film is improved.

Seventh Embodiment

Figure 8:
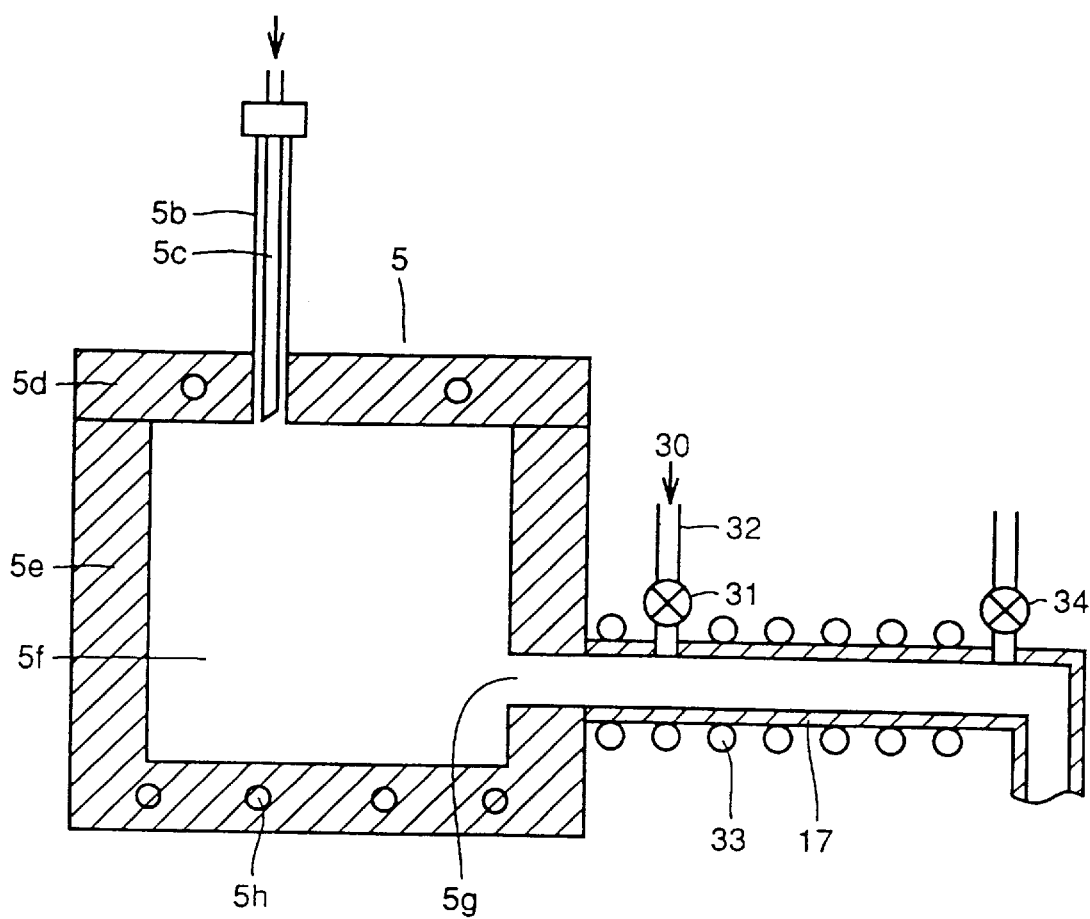
FIG. 8 illustrates a cross sectional structure of a vaporizer of a chemical vapor deposition apparatus according to the seventh embodiment.

A chemical vapor deposition apparatus according to the seventh embodiment is described. Source transport pipe 17 of the apparatus for delivering the CVD source vaporized in vaporizer 5 to reaction unit 11 has a structure shown in FIG. 8. With reference to FIG. 8, a liquid organic solvent supply valve 31 for introducing a liquid organic solvent 30 as a cleaning liquid is provided adjacent to source transport pipe 17 and vaporizer 5. Further, a liquid organic solvent discharge valve 34 for discharging the liquid organic solvent introduced into source transport pipe 17 is provided adjacent to source transport pipe 17 and reaction unit 11. Other structures are similar to those of the chemical vapor deposition apparatuses according to the first to the sixth embodiments or the combination thereof, and detailed descriptions thereof are omitted.

In the chemical vapor deposition apparatus of the seventh embodiment, after the formation of the BST film is completed, liquid organic solvent supply valve 31 is opened with the temperature of source transport pipe 17 decreased to the room temperature, and organic solvent 30 is supplied to source transport pipe 17. Using the organic solvent supplied to source transport pipe 17, the inner wall of the source transport pipe is cleaned, and the organic solvent is thereafter discharged from the liquid organic solvent discharge valve. Accordingly, contaminants such as residues sticking to the inner wall of source transport pipe 17 are removed, so that the CVD source gas can be supplied from the vaporization chamber to the reaction unit in a stable state. As a result, the quality of the thin film formed on a substrate is stabilized.

Preferably, tetrahydrofuran which is the same as the solvent is employed as the liquid organic solvent. Further, the cleaning liquid may be discharged utilizing a vent line.

Eighth Embodiment

Figure 9:
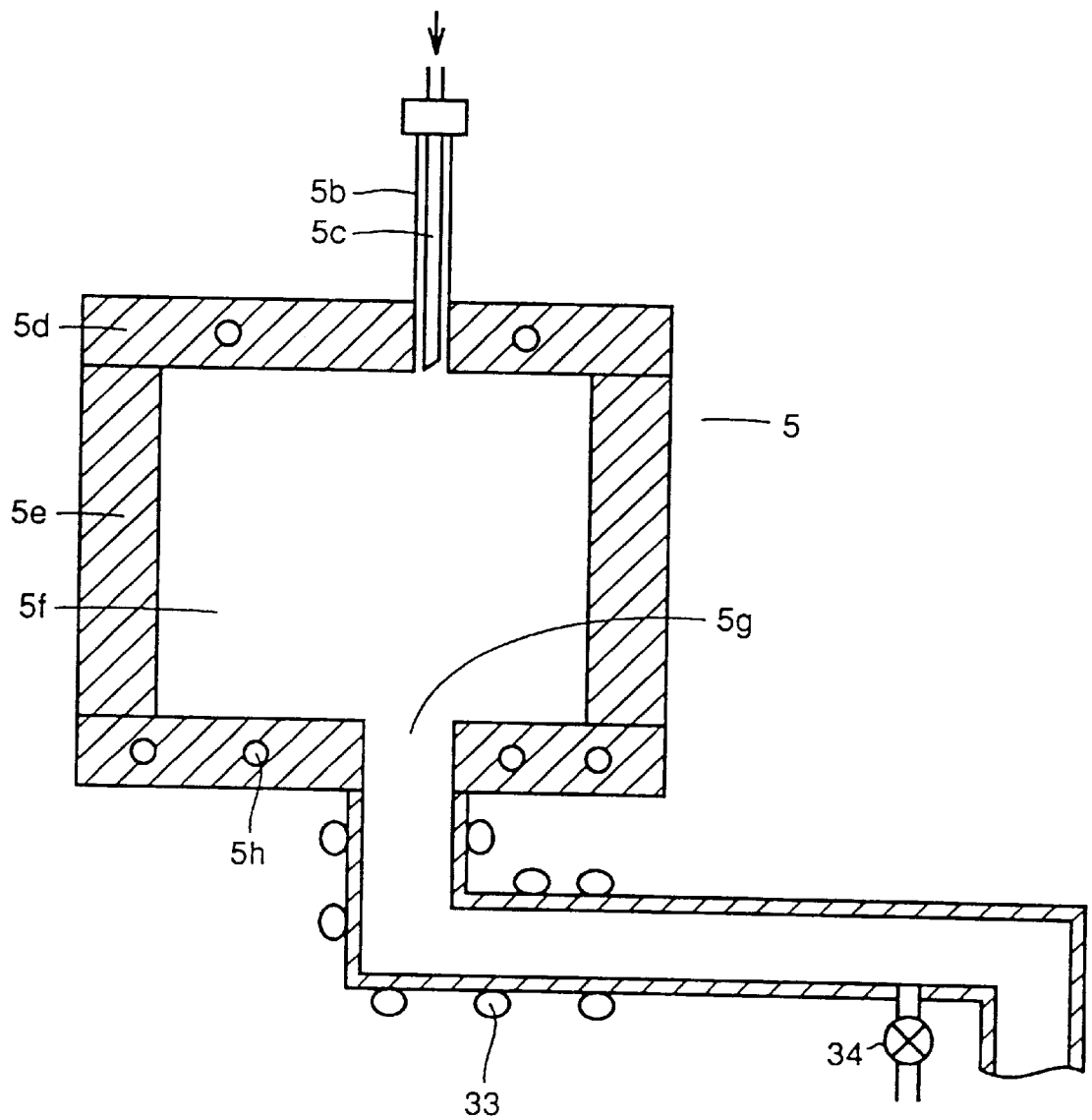
FIG. 9 illustrates a cross sectional structure of a vaporizer of a chemical vapor deposition apparatus according to the eighth embodiment.

A chemical vapor deposition apparatus according to the eighth embodiment is described. The vaporizer and the source transport pipe of this apparatus has a structure shown in FIG. 9. With reference to FIG. 9, nozzle 5c and source transport pipe connection hole 5g are provided having vaporization chamber 5f therebetween respectively in a substantially vertical direction. The organic solvent as the cleaning liquid is introduced into nozzle 5c. The organic solvent from nozzle 5c reaches source transport pipe connection hole 5g and is introduced into source transport pipe 17. The organic solvent introduced into source transport pipe 17 is discharged from liquid organic solvent discharge valve 34. Accordingly, contaminants sticking to the inner wall of the source transport pipe and the nozzle are removed, so that stable supply of the CVD source gas to the reaction unit can be obtained. As a result, the quality of the thin film formed on a substrate is further stabilized.

Similar effects can be obtained even if the vaporization chamber has the cylindrical shape which is described in relation to the first to the fourth embodiments.

Ninth Embodiment

Figure 10A:
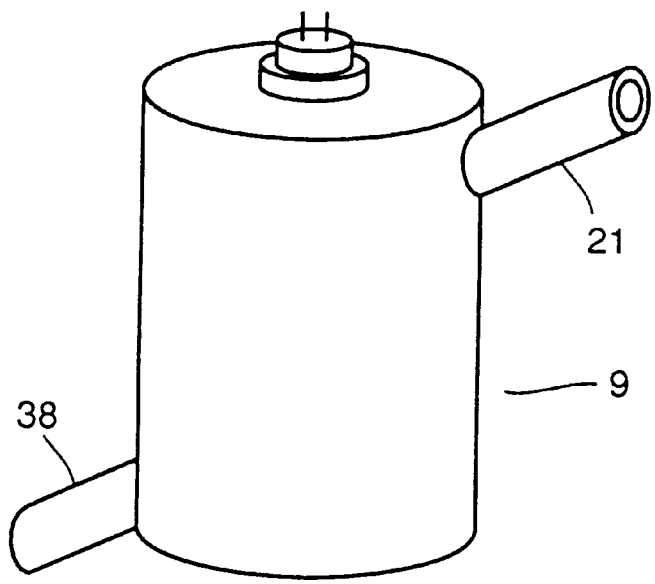
FIGS. 10A and 10B respectively show a cross sectional structure of an oxidizer heating unit of a chemical vapor deposition apparatus according to the ninth embodiment.
Figure 10B:
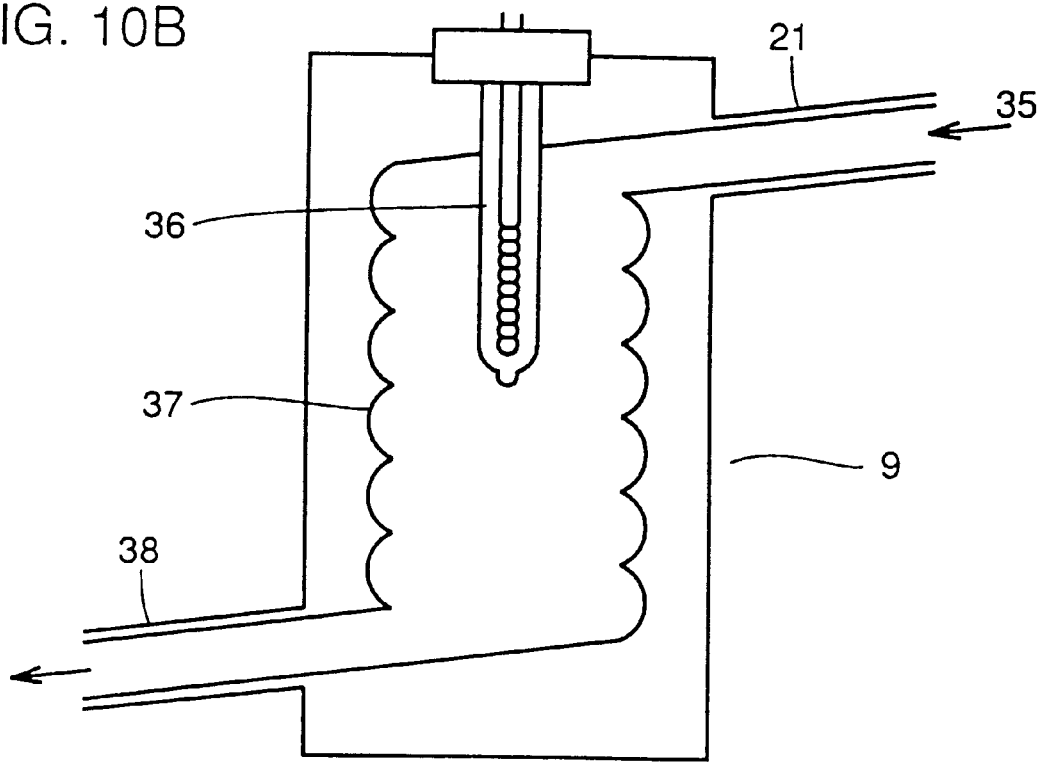

A chemical vapor deposition apparatus according to the ninth embodiment is described below. An oxidizer heating unit of this apparatus has a structure show in FIGS. 10A and 10B. FIG. 10B is a vertical cross sectional structure of the oxidizer heating unit shown in FIG. 10A. With reference to FIG. 10B, oxidizer heating unit 9 is provided with an oxidizer supply inlet 35, a helical groove 37, an oxidizer discharge outlet 38, and a halogen lamp 36. Other structures are similar to those according to the first to the eighth embodiments or the combination thereof, and detailed descriptions thereof are omitted.

Oxygen as an oxidizer supplied from oxidizer supply inlet 35 flows along helical groove 37. The oxygen is heated by halogen lamp 36. Since the oxygen flows along helical groove 37, it is sufficiently heated by halogen lamp 36. The fully heated oxygen is delivered from oxidizer discharge outlet 38 to the mixer portion. The oxygen is heated by oxidizer heating unit 9 enough to generate no residue of the CVD source which would be produced when the CVD source is mixed with the oxygen at the mixer portion.

Almost no oxygen is diffused back to the source transport pipe. As a result, the temperature of the CVD source gas is not decreased, and the film can be formed on a substrate over a long period. Specifically, the frequency of the cleaning of the mixer portion is decreased from once per formation of one hundred BST films to once per formation of at least eight hundreds films. Further, almost the same composition ratio of the BST film is achieved.

Tenth Embodiment

Figure 11:
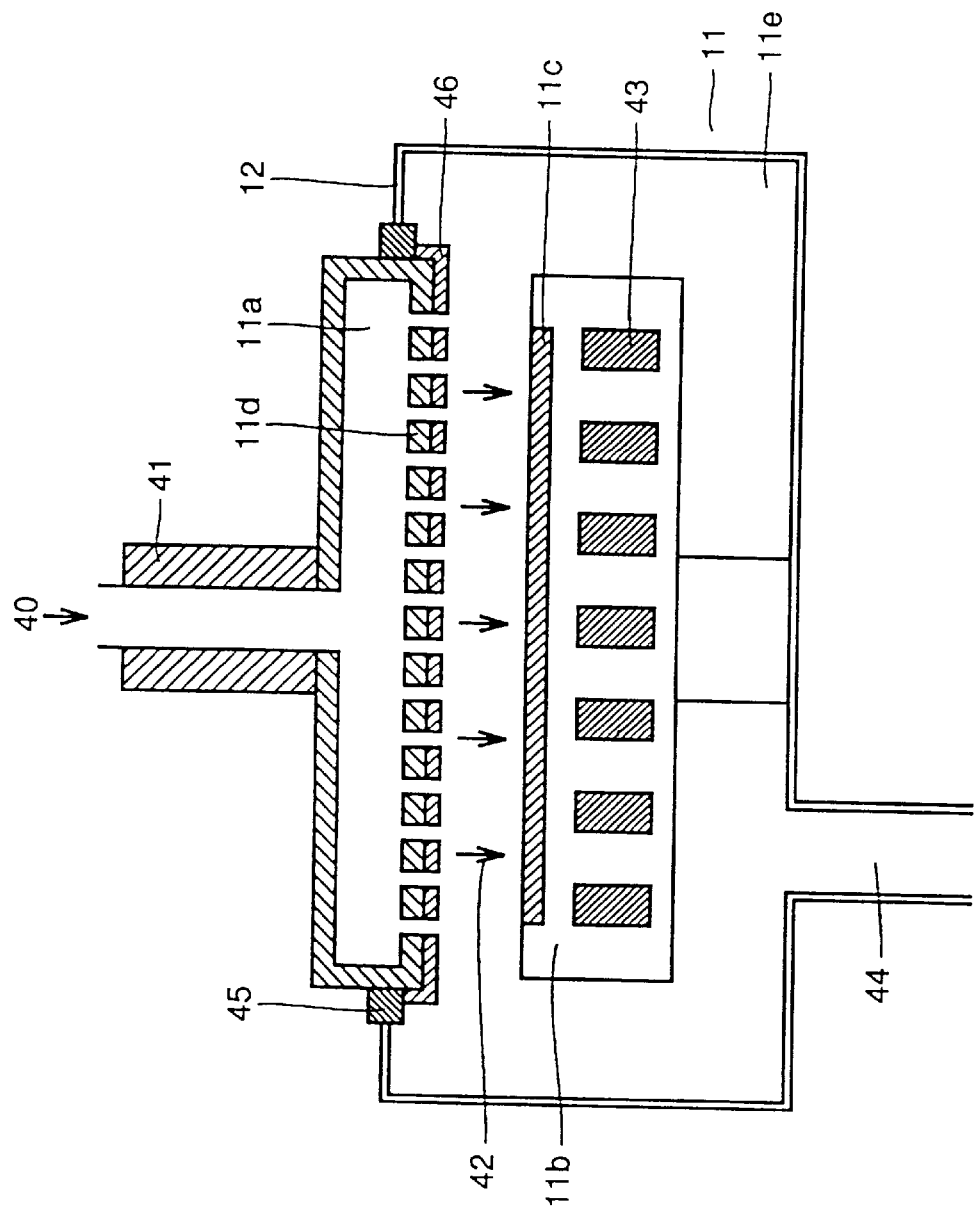
FIGS. 11–14 respectively show cross sectional structures of reaction chambers of chemical vapor deposition apparatuses according to the tenth to the thirteenth embodiment of the invention.

A chemical vapor deposition apparatus according to the tenth embodiment is described below. A reaction unit of this apparatus has a structure shown in FIG. 11. With reference to FIG. 11, reaction unit 11 includes a reaction chamber 11e, a gas head 11a and a wafer stage 11b at which a substrate 11c is mounted. Gas head 11a is provided with a plurality of gas nozzles 11d for spouting out the CVD source gas and the oxygen. A substrate heater 43 for heating substrate 11c is provided to wafer stage 11b. Gas head 11a is fixed to an inner wall 12 of the reaction chamber with a ceramic block 45 therebetween. Adjacent to gas nozzle 11d, an aluminum coating layer 46 which is processed to have a reflectance exceeding a prescribed reflectance and has a smoothed surface is formed. Other structures are similar to those according to the first to the ninth embodiments or the combination thereof, and detailed descriptions thereof are omitted.

The CVD source gas and oxygen 40 is introduced into gas head 11a and the temperature of the gas and oxygen is not lowered owing to a heater 41 for the source introduction pipe. The temperature of the source introduction pipe heater 41 is approximately 250° C. At this temperature, decomposition or solidification of the CVD source gas does not occur. The CVD source gas and oxygen introduced into gas head 11a is dispersed over substrate 11c through a plurality of gas nozzles 11d. Substrate 11c is heated by substrate heater 43 to a temperature range of 400–600° C. A BST film is thus formed over substrate 11c.

Gas head 11a is fixed to inner wall of reaction chamber 12 by ceramic block 45. Ceramic block 45 has a low thermal conductivity thereby preventing the heat of the gas nozzle 11d and its vicinity from conducting to reaction chamber inner wall 12. As a result, decrease of the temperature of gas head 11a is suppressed. Further, since the surface of aluminum coating layer 46 formed adjacent to gas nozzle 11d is smoothed, most of the heat ray radiated from substrate heater 43 is reflected by the surface. As a result, excessive increase of the temperature of gas nozzle 11d and its vicinity is suppressed and the temperature is kept at approximately 250° C. Accordingly, the CVD source gas is not decomposited around gas nozzle 11d, and a prescribed amount of the CVD source is dispersed over substrate 11c. Stable formation of the BST film is thus achieved.

As for the smoothing process applied to aluminum coating layer 46, another process may be utilized in which the reflectance for the heat ray (the ratio of the energy of the heat ray reflected by the surface to the energy of the heat ray incident on the surface) is made higher. For example, the mirror finish may be applied to the aluminum coating layer 46. The aluminum may be replaced with other materials which have a higher reflectance for the heat ray by the smoothing process.

The process is not limited to the one described above, and another process which provides a reflectance preventing the temperature of the gas nozzle from excessively increasing by reflection of the heat ray may be utilized.

Eleventh Embodiment

Figure 12:
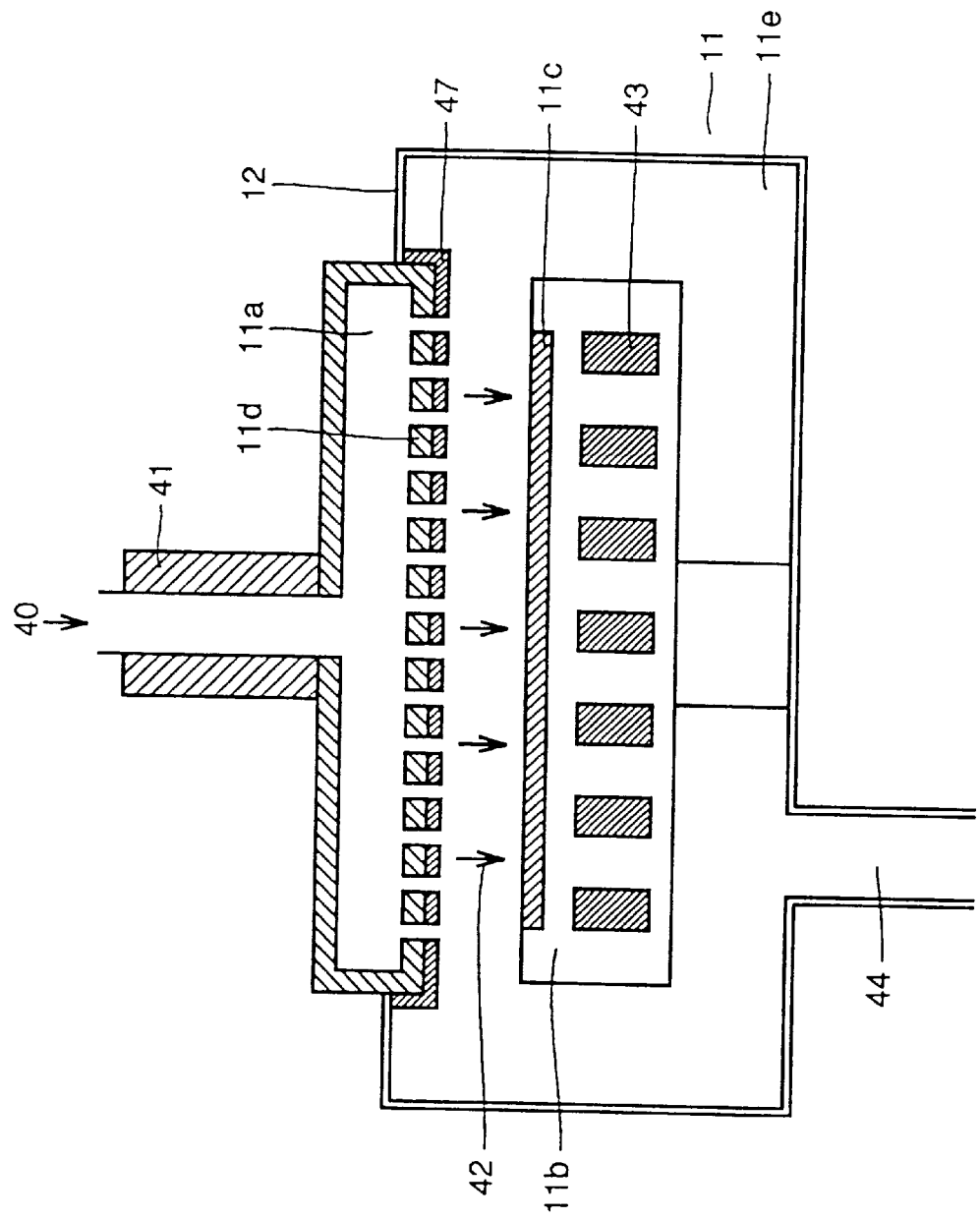

Description of a chemical vapor deposition apparatus according to the eleventh embodiment is given below. The apparatus is provided with reaction unit 11 having structure shown in FIG. 12. Referring to FIG. 12, an anodized aluminum black layer 47 which is processed to have thermal absorbency exceeding prescribed one is formed adjacent to gas head 11a. The thermal absorbency is the ability of a material to absorb the heat. Gas head 11a is directly fixed to inner wall of reaction chamber 12. Other structures will not be described in detail since they are similar to those according to the tenth embodiment.

The heat of gas nozzle 11d and its vicinity is lost due to the radiation from gas nozzle 11d, or conduction from the gas nozzle 11d and its vicinity to reaction chamber inner wall 12. As a result, the temperature of gas nozzle 11d and its vicinity is decreased. Anodized aluminum black layer 47 provided adjacent to gas nozzle 11d absorbs the heat ray radiated from substrate heater 43 and compensates for the temperature drop of gas nozzle 11d, so that the temperature of gas nozzle 11d is maintained at approximately 250° C. Accordingly, solidification of the CVD source gas around gas nozzle 11d never occurs, and a prescribed amount of CVD source gas is dispersed over substrate 11c. As a result, the BST film can be formed in a stable state.

The anodized aluminum black layer may be replaced with, for example, alumina, SiC (Silicon Carbide) or the like.

As for the process to provide the thermal absorbency exceeding prescribed one, a process which provides absorption of the heat ray to allow compensation of the drop of the temperature of the gas nozzle may be utilized other than the process described above.

Twelfth Embodiment

Figure 13:
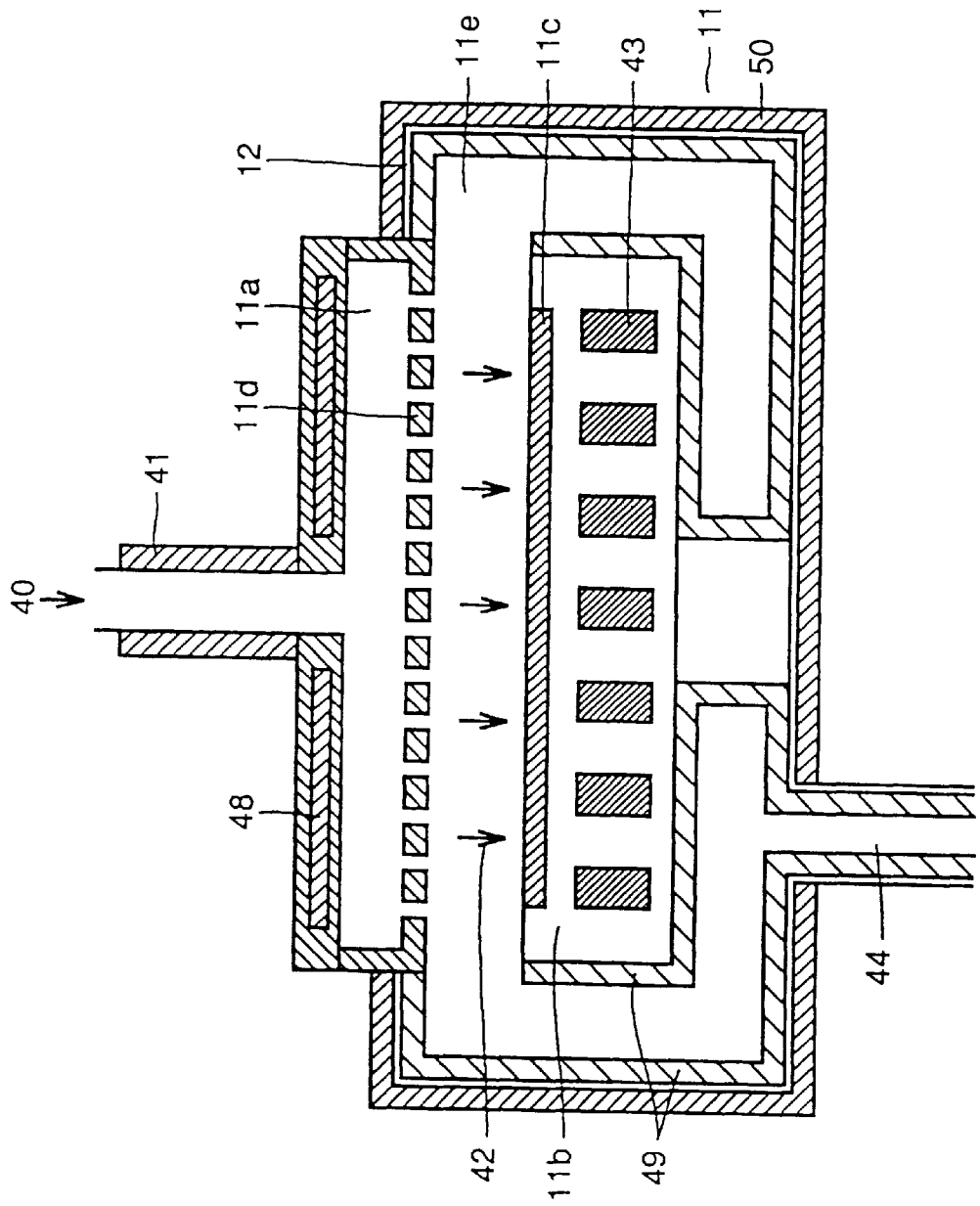

A chemical vapor deposition apparatus according to the twelfth embodiment is described referring to the figure. A reaction chamber of the apparatus has a structure shown in FIG. 13. With reference to FIG. 13, a silicon oxide film 49 is formed as an inactive cover layer at the surfaces of reaction chamber inner wall 12 and stage 11b. A gas head heater 48 is provided to gas head 11a. A heater for inner wall of reaction chamber 50 is provided outside reaction chamber inner wall 12. Since other structures are similar to those according to the first to the eleventh embodiments or the combination thereof, detailed descriptions are omitted.

The CVD source gas and oxygen 40 introduced int gas head 11a is dispersed over substrate 11c from gas nozzle 11d and diffused in reaction chamber 11. Reaction chamber inner wall 12 is heated to a prescribed temperature by reaction chamber inner wall heater 50. If the temperature is 200° C. or less, the CVD source gas could liquefy and stick to the inner wall. At the temperature of 500° C. or more, the reaction product may stick thereto. Accordingly, the inner wall is desirably heated to a range of 200–500° C., and more desirable range is 300–500° C. In this temperature range, almost no reaction product sticks to reaction chamber inner wall 12 covered with silicon oxide film 49. As a result, no contaminant drops from the inner wall of the reaction chamber onto substrate 11c. The cleaning within reaction chamber 11e becomes easier, and the operating efficiency of the chemical vapor deposition apparatus can be improved.

Thirteenth Embodiment

Figure 14:
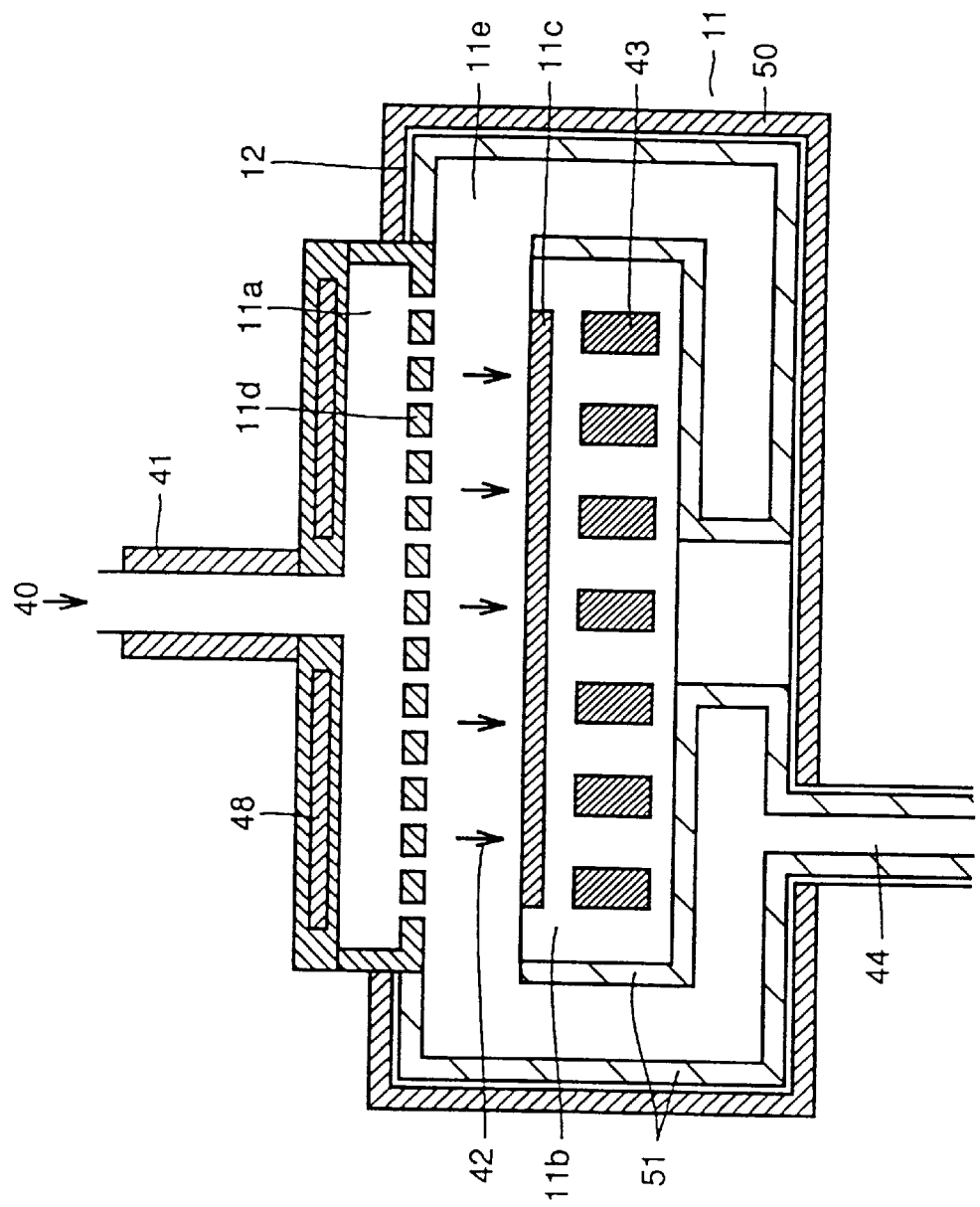
Figure 15:
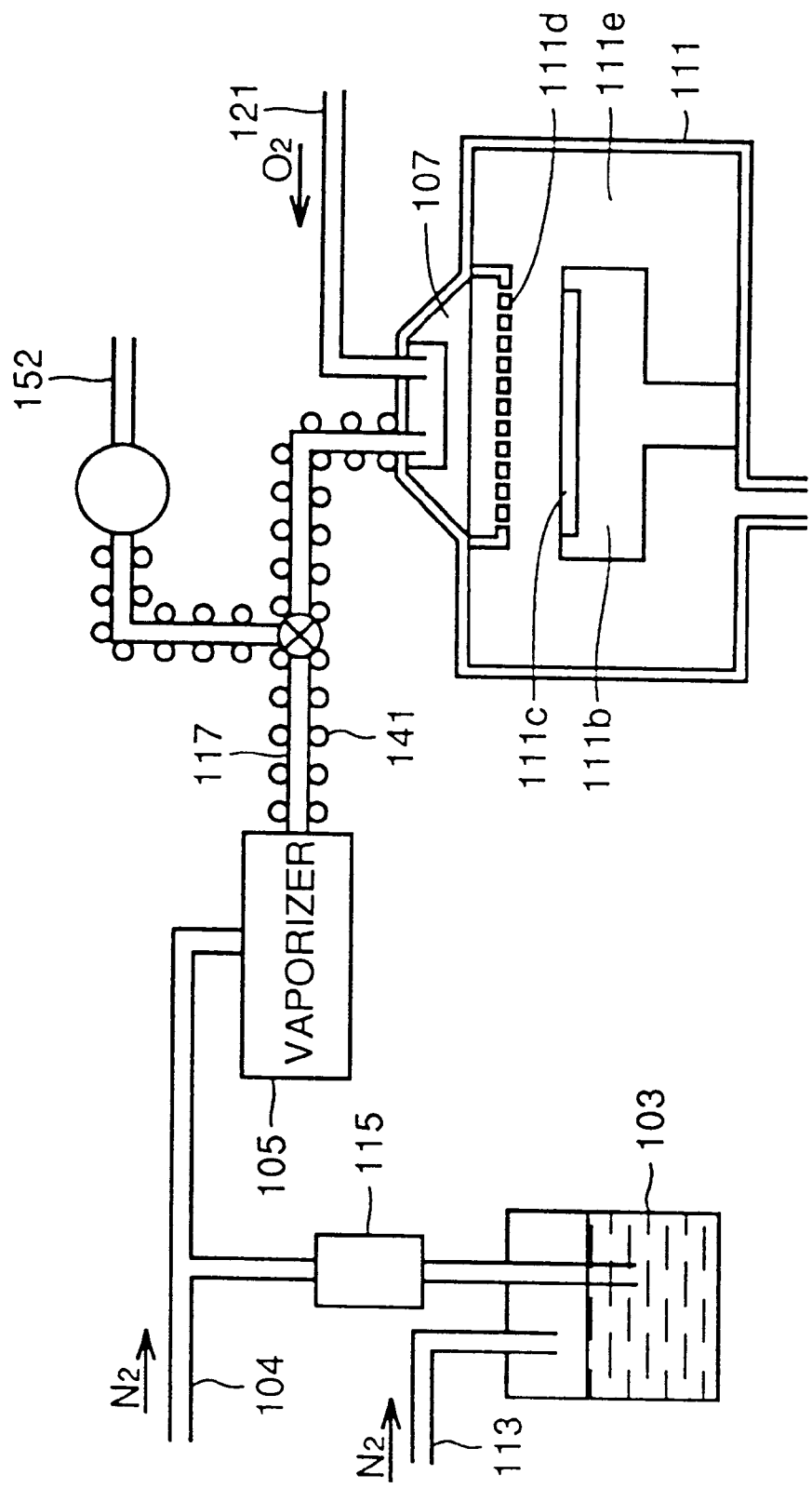
FIG. 15 shows a structure of a conventional chemical vapor deposition apparatus.

Description of a chemical vapor deposition apparatus according to the thirteenth embodiment is given below. Reaction chamber 11 of the apparatus has a structure shown in FIG. 14. Referring to FIG. 14, a quartz layer 51 as an inactive cover layer is formed at surfaces of reaction chamber inner wall 12 and stage 11b. Other structures are similar to those according to the twelfth embodiment, and detailed descriptions thereof are omitted.

As described in relation to the twelfth embodiment, reaction chamber inner wall 12 is heated to a temperature range of 300–500° C. by reaction chamber inner wall heater 50. Accordingly, almost no reaction product sticks to reaction chamber inner wall 12 covered with quartz layer 51. As a result, almost no contaminant drops from the inner wall of the reaction chamber onto substrate 11c. Further, he cleaning of reaction chamber 11 becomes easier and the availability factor of the apparatus can be improved.

According to each embodiment described above, an organometallic complex as a metallic compound is employed for producing the BST film $(BaSr)TiO_3$ on the substrate. Specifically, barium dipivaloylmethanato $[Ba(DPM)_2]$, strontium dipivaloylmethanato $[Sr(DPM)_2]$, and titanyl dipivaloylmethanato $[Tio(DPM)_2]$ are utilized. An organic solvent is used as a solvent. Specifically, tetrahydrofuran [THF] is employed.

The CVD source may be any if it can provide the BST film $(BaSr)TiO_3$ on the substrate. Other organometallic complexes respectively containing Ba, Sr, and Ti, or a metallic compound containing those metals may be used. Another solvent other than the organic solvent may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A chemical vapor deposition apparatus comprising:
    a source container for storing a CVD source obtained by dissolving a metallic compound in a solvent;
    a vaporizer connected to said source container for vaporizing the CVD source supplied from said source container; and
    a reaction unit connected to said vaporizer for dispersing the vaporized CVD source delivered from said vaporizer over a substrate to form a thin film;
    said vaporizer includes
        a vaporizer chamber for vaporizing the CVD source supplied from said source container, and
        a nozzle for introducing said CVD source into said vaporization chamber, the nozzle having a nozzle tip portion and a thick nozzle portion connected to said nozzle tip portion and having an outer diameter larger than that of said nozzle tip portion.

2. The chemical vapor deposition apparatus according to claim 1, wherein
    said vaporizer includes a vaporization chamber having a substantially cylindrical space, and wherein
    the CVD source supplied from said source container is introduced from one portion of a cylindrical side surface surrounding said cylindrical space into said vaporization chamber, and the vaporized CVD source is delivered from another portion of said cylindrical side surface to said reaction unit.

3. The chemical vapor deposition apparatus according to claim 1, further comprising:
    a source transport pipe for delivering the vaporized CVD source from said vaporizer to said reaction chamber;

a cleaning liquid inlet for introducing a cleaning liquid into said source transport pipe; and a cleaning liquid outlet for discharging cleaning liquid introduced into said source transport pipe.

4. The chemical vapor deposition apparatus according to claim 1, wherein said reaction unit includes a heating element for heating the substrate and a gas nozzle for dispersing said vaporized CVD source over said substrate, and wherein a surface of said gas nozzle is processed to have one of a predetermined reflectance to reflect incident radiation and a predetermined thermal conductivity to conduct radiation for maintaining a temperature of said gas nozzle at a predetermined temperature.

5. The chemical-vapor deposition apparatus according to claim 1, wherein said vaporizer further includes a nozzle for introducing the CVD source into said vaporizer, and a nozzle-insert-pipe into which said nozzle is inserted, wherein an inert gas is introduced into said nozzle-insert-pipe, and said inert gas introduced into said nozzle-insert-pipe is spouted out from said nozzle.

6. The chemical vapor deposition apparatus according to claim 1, wherein organometallic complexes respectively containing Ba, Sr, and Ti are used as said metallic compound, and an organic solvent is used as said solvent.

7. A chemical vapor deposition apparatus comprising:

a source container for storing a CVD source obtained by dissolving a metallic compound in a solvent;

a vaporizer connected to said source container for vaporizing the CVD source supplied from said source container; and a reaction unit connected to said vaporizer for dispersing the vaporized CVD source delivered from said vaporizer over a substrate to form a thin film;

said reaction unit includes a mixing unit for mixing the CVD source vaporized and delivered from said vaporizer with an oxidizer, and said mixing unit includes an oxidizer supply pipe for supplying an oxidizer to the vaporized CVD source, and a heating portion including a heating element and a helical side groove formed in said oxidizer supply pipe and defining a helical flow path for at least a portion of the oxidizer.

8. The chemical vapor deposition apparatus according to claim 7, wherein said vaporizer includes a vaporization chamber having a substantially cylindrical space, and wherein the CVD source supplied from said source container is introduced from one portion of a cylindrical side surface surrounding said cylindrical space into said vaporization chamber, and the vaporized CVD source is delivered from another portion of said cylindrical side surface to said reaction unit.

9. The chemical vapor deposition apparatus according to claim 7, further comprising:

a source transport pipe for delivering the vaporized CVD source from said vaporizer to said reaction chamber;

a cleaning liquid inlet for introducing a cleaning liquid into said source transport pipe; and a cleaning liquid outlet for discharging cleaning liquid introduced into said source transport pipe.

10. The chemical vapor deposition apparatus according to claim 7, wherein said reaction unit includes a heating element for heating the substrate and a gas nozzle for dispersing said vaporized CVD source over said substrate, and wherein a surface of said gas nozzle is processed to have one of a predetermined reflectance to reflect incident radiation and a predetermined thermal conductivity to conduct radiation for maintaining a temperature of said gas nozzle at a predetermined temperature.

11. The chemical vapor deposition apparatus according to claim 7, wherein said vaporizer includes a nozzle for introducing the CVD source into said vaporizer, and a nozzle-insert-pipe into which said nozzle is inserted, and wherein an inert gas is introduced into said nozzle-insert-pipe, and said inert gas introduced into said nozzle-insert-pipe is spouted out from said nozzle.

12. The chemical vapor deposition apparatus according to claim 7, wherein organometallic complexes respectively containing Ba, Sr and Ti are used as said metallic compound, and an organic solvent is used as said solvent.

13. A chemical vapor deposition apparatus comprising:

a source container for storing a CVD source obtained by dissolving a metallic compound in a solvent;

a vaporizer connected to said source container for vaporizing the CVD source supplied from said source container;

a reaction unit connected to said vaporizer for dispersing the vaporized CVD source delivered from said vaporizer over a substrate to form a thin film;

an inactive cover layer covering at least a portion of an inner wall surface of said reaction chamber; and a heating element configured to maintain said inner wall surface between 300° C. and 500° C.

14. The chemical vapor deposition apparatus according to claim 13, wherein said vaporizer includes a vaporization chamber having a substantially cylindrical space, and wherein the CVD source supplied from said source container is introduced from one portion of a cylindrical side surface surrounding said cylindrical space into said vaporization chamber, and the vaporized CVD source is delivered from another portion of said cylindrical side surface to said reaction unit.

15. The chemical vapor deposition apparatus according to claim 13, further comprising:

a source transport pipe for delivering the vaporized CVD source from said vaporizer to said reaction chamber;

a cleaning liquid inlet for introducing a cleaning liquid into said source transport pipe; and a cleaning liquid outlet for discharging cleaning liquid introduced into said source transport pipe.

16. The chemical vapor deposition apparatus according to claim 13, wherein said reaction unit includes a heating element for heating the substrate and a gas nozzle for dispersing said vaporized CVD source over said substrate, and wherein a surface of said gas nozzle is processed to have one of a predetermined reflectance to reflect incident radiation and a predetermined thermal conductivity to conduct radiation for maintaining a temperature of said gas nozzle at a predetermined temperature.

17. The chemical vapor deposition apparatus according to claim 13, wherein
   said vaporizer includes
      a nozzle for introducing the CVD source into said vaporizer, and
      a nozzle-insert-pipe into which said nozzle is inserted, and wherein
      an inert gas is introduced into said nozzle-insert-pipe, and said inert gas introduced into said nozzle-insert-pipe is spouted out from said nozzle.

18. The chemical vapor deposition apparatus according to claim 13, wherein
   organometallic complexes respectively containing Ba, Sr, and Ti are used as said metallic compound, and an organic solvent is used as said solvent.

* * * * *